(12) United States Patent
Sun

(10) Patent No.: US 9,787,275 B2
(45) Date of Patent: Oct. 10, 2017

(54) LOW VOLTAGE ELECTROMAGNETIC INTERFERENCE FILTER OF ELECTRIC VEHICLE

(71) Applicant: LSIS CO., LTD., Anyang-si, Gyeonggi-do (KR)

(72) Inventor: Jong In Sun, Incheon-si (KR)

(73) Assignee: LSIS CO., LTD., Anyang-si (KR)

( * ) Notice: Subject to any disclaimer, the term of this patent is extended or adjusted under 35 U.S.C. 154(b) by 526 days.

(21) Appl. No.: 14/447,292

(22) Filed: Jul. 30, 2014

(65) Prior Publication Data

US 2015/0171817 A1 Jun. 18, 2015

(30) Foreign Application Priority Data

Dec. 18, 2013 (KR) ........................ 10-2013-0158757

(51) Int. Cl.
| | |
|---|---|
| *B60L 1/00* | (2006.01) |
| *B60L 3/00* | (2006.01) |
| *H02G 3/00* | (2006.01) |
| *H03H 7/01* | (2006.01) |
| *B60R 16/02* | (2006.01) |
| *B60L 11/18* | (2006.01) |

(Continued)

(52) U.S. Cl.
CPC ........ *H03H 7/0115* (2013.01); *B60L 11/1811* (2013.01); *B60R 16/02* (2013.01); *H02M 1/126* (2013.01); *B60L 2270/147* (2013.01); *H02M 1/44* (2013.01); *H02M 2001/123* (2013.01); *Y02T 10/7005* (2013.01); *Y02T 10/7072* (2013.01); *Y02T 90/127* (2013.01); *Y02T 90/14* (2013.01)

(58) Field of Classification Search
CPC .. B60L 11/1811; H03H 7/0115; H02M 1/126; B60R 16/02
USPC .......................................................... 307/9.1
See application file for complete search history.

(56) References Cited

U.S. PATENT DOCUMENTS 7,547,987 B2 * 6/2009 Torigoe .................. H02M 1/44
307/10.1
2008/0074227 A1 3/2008 Chen et al.
(Continued)

FOREIGN PATENT DOCUMENTS

| CN | 101197205 | 6/2008 |
|---|---|---|
| CN | 101309053 | 11/2008 |

(Continued)

OTHER PUBLICATIONS

European Patent Office Application Serial No. 14179431.3, Search Report dated Sep. 24, 2015, 8 pages.
(Continued)

*Primary Examiner* — Carlos Amaya
(74) *Attorney, Agent, or Firm* — Lee, Hong, Degerman, Kang & Waimey

(57) ABSTRACT

A low voltage electromagnetic interference (EMI) filter of an electric vehicle is provided. In the low voltage EMI filter, a pair of Y capacitor units are respectively installed in input and output ends of the low voltage EMI filter. A normal mode (DM) filter and a common mode (CM) filter are installed between the pair of Y capacitor units. The pair of Y capacitor units, the DM and CM filters discharge CM and DM noises generated in a low voltage battery connection unit to a sash GND (earth) step by step and reduce noises of the low voltage battery connection unit.

11 Claims, 6 Drawing Sheets

(51) Int. Cl.
*H02M 1/12* (2006.01)
*H02M 1/44* (2007.01)

(56) References Cited

U.S. PATENT DOCUMENTS

| | | | |
|---|---|---|---|
| 2008/0205089 A1 | 8/2008 | Zhu et al. | |
| 2011/0094075 A1 | 4/2011 | Lee et al. | |
| 2013/0049918 A1 | 2/2013 | Fu et al. | |
| 2014/0266507 A1* | 9/2014 | Fauer | H02M 1/10 333/181 |

FOREIGN PATENT DOCUMENTS

| | | |
|---|---|---|
| CN | 102044959 | 5/2011 |
| CN | 102104276 | 6/2011 |
| CN | 201966798 | 9/2011 |
| CN | 202889189 | 4/2013 |
| CN | 103187757 | 7/2013 |
| EP | 2618449 | 7/2013 |
| JP | 61-90314 | 6/1986 |
| JP | 63-245262 | 10/1988 |
| JP | 09-172735 | 6/1997 |
| JP | 10-256859 | 9/1998 |
| JP | 2000-299902 | 10/2000 |
| JP | 2003116267 | 4/2003 |
| JP | 2005-294975 | 10/2005 |
| JP | 2009-296756 | 12/2009 |
| JP | 2011-223557 | 11/2011 |
| JP | 2013-110580 | 6/2013 |
| JP | 2013-247817 | 12/2013 |
| KR | 1020050078537 | 8/2005 |
| KR | 1020130068644 | 6/2013 |
| KR | 2020130006019 | 10/2013 |
| WO | 2012/070117 | 5/2012 |

OTHER PUBLICATIONS

Korean Intellectual Property Office Application No. 10-2013-0158757, Office Action dated Dec. 19, 2016, 4 pages.
State Intellectual Property Office of the People's Republic of China Application Serial No. 201410645935.5, Office Action dated Apr. 17, 2017, 8 pages.

* cited by examiner

LOW VOLTAGE ELECTROMAGNETIC INTERFERENCE FILTER OF ELECTRIC VEHICLE

CROSS-REFERENCE TO RELATED APPLICATIONS

Pursuant to 35 U.S.C. §119(a), this application claims the benefit of earlier filing date and right of priority to Korean Patent Application No. 10-2013-0158757, filed on Dec. 18, 2013, the contents of which are all hereby incorporated by reference herein in its entirety.

BACKGROUND

The present disclosure relates to a low voltage electromagnetic interference (EMI) filter in an electric vehicle, and more particularly, to a low voltage EMI filter in an electric vehicle reducing an EMI noise inside an electronic device, which charges a low voltage battery, and rapidly passing a noise generated during charging the low voltage battery to a vehicle sash ground.

Recently, environmentally friendly vehicles attract interests due to environmental problems, and expectations are increased in mass production and popularization of the electric vehicles among the environmentally friendly vehicles. In particular, interests are increased in a noise reducing technology in terms of the EMI according to high electric use characteristics of electronic devices of the electric vehicles. Furthermore, noise level specification for EMI is enforced to electronic device manufacturers in domestic and foreign original equipment manufacturing (OEM) fields of the electronic vehicles, and international organizations enforce criteria for reducing the EMI noise of the electronic devices. Accordingly, electronic device manufacturers meet a more and more severe environment in developing electronic devices.

The core of driving an electric vehicle lies in a battery component. In particular, there are various EMI noise components inside the electric vehicle, such as a charging noise generated in charging a battery, or a switching noise of a charger itself, and interests are increased in a technology for reducing the various EMI noises.

The EMI is a noise source of an unwanted wideband noise and means that the noise causes interference and hindrance to an electromagnetic wave.

A power source noise is largely divided into a common mode noise and a normal mode noise. First, the common mode noise indicates that noises in plus and minus ends of a power source flow in the same direction and is called a CM noise.

The normal mode noise indicates that noises in the plus and minus ends of the power source flow in different directions and is called a DM noise. Accordingly, a filter reducing the CM noise is called a CM filter, and a filter reducing the DM noise is called a DM filter.

An EMI filter includes a CM filter and a DM filter.

FIG. 1 is a view illustrating a typical EMI filter.

Referring to FIG. 1, the typical EMI filter has a structure having a DM filter 2 connected to a battery 1, and a CM filter 3 connected to the DM filter 2 having an Y capacitor 3 intervened between them.

The DM filter 2 includes a π type capacitor, and the CM filter 4 includes an inductor and a capacitor. The Y capacitor 3 draws out, to a sash ground (i.e., an earth GND), a noise component which passes through the DM filter 2.

The DM filter 2 first absorbs and reduces a noise component induced in a low voltage battery 1, which accordingly increases capacity of a capacitor and an inductance value of an inductor of the DM filter 2.

Actually, it is confirmed that a noise filtering effect in the DM filter 2 is small during measuring a noise level in an EMI test laboratory. Furthermore, since the noise induced in the low voltage battery 1 is transferred to the DM filter 2 in a mixed type of the CM noise and the DM noise, in case of analysis in terms of the DM filter 2, the CM noise passes without being filtered out and is drawn out to the sash ground (the earth) through the Y capacitor 3 without a change.

In particular, since an impedance component are various according to characteristics of each electronic device due to a connector impedance in the electronic device and a harness connected to the connector, it is difficult to determine which noise of the CM and DM noises causes a problem.

In addition, only the DM noise is filtered in a first capacitor C1, a first inductor L1, and the second capacitor C2 of the DM filter 2, and the DM and CM noises are filtered through the Y capacitor Cy1 and Cy2.

That is, since the CM noise is filtered after passing through the DM filter 2, there is no noise reduction effect in case of products having the CM noise.

FIG. 2 is a view for illustrating an effect of a noise generated when a typical EMI filter is connected to a switched-mode power supply (SMPS).

Referring to FIG. 2, the EMI filter (DM filter) 2 is installed in the battery 1 and the SMPS 5 is connected to the EMI filter (DM filter) 2.

Typically, although this kind of power supplying circuit is configured by assuming that a noise component is reduced in the EMI filter (DM filter) 2, a noise actually remains after passing the EMI filter (DM filter) 2. The noise passing through the EMI filter (DM filter) 2 may also become increased from a small noise state by the SMPS 5. Accordingly, the noise remained after passing through the EMI filter (DM filter) 2 is required to be reduced before entering the SMPS 5.

In order to reduce the noise induced in the low voltage battery, the EMI noise of the electronic device directly connected to the low voltage battery is required to be reduced and for this, the noise is first to be required to be reduced through the EMI filter.

Although a noise reducing technology through the EMI filter is extended from an industrial electronic device to an automotive electronic device, a noise reduction effect is negligible with a typical EMI filter in the automotive electronic device having high noise criteria.

In terms of characteristics of an electric vehicle, a low noise battery is weaker to a noise than a battery of an internal combustion engine according to electric driving and load characteristics.

Side effect characteristics, such as life-shortening of a battery and fuel-efficiency reduction, become high, as a noise component becomes great in the low voltage battery. Accordingly, a noise induced in the low voltage battery is necessary to be reduced. In addition, OEM companies of the domestic and foreign electric vehicle manufacturers also acutely feel this necessity.

SUMMARY

Embodiments provide a low voltage electromagnetic interference filter in an electric vehicle, which reduces an EMI noise inside an electronic device charging a low voltage battery and rapidly passes a noise generated during charging the low voltage battery to a vehicle sash ground.

The objectives of the present invention are limited to the above-described. The objectives not mentioned in the above should be clearly understood by those skilled in the art from description below.

In one embodiment, low voltage electromagnetic interference (EMI) filter of an electric vehicle, includes: a pair of Y capacitor units respectively installed in input and output ends of the low voltage EMI filter; and a normal mode (DM) filter and a common mode (CM) filter installed between the pair of Y capacitor units, wherein the pair of Y capacitor units, the DM and CM filters discharge CM and DM noises generated in a low voltage battery connection unit to a sash GND (earth) step by step and reduce noises of the low voltage battery connection unit.

The pair of Y capacitor units may include first and second Y capacitor units, wherein the first Y capacitor unit is installed at both ends of a low voltage battery and discharges the noises to the sash GND (earth) to reduce the DM and CM noises, the DM filter is installed at both ends of the first Y capacitor unit to reduce the DM noise with respect to the noises reduced by the first Y capacitor unit, the CM filter is installed at both ends of the DM filter to reduce the CM noise with respect to the noise reduced by the DM filter, and the second Y capacitor unit is installed at both ends of the CM filter and discharges noises to the sash GND (earth) to reduce the DM and CM noises with respect to the noise reduced by the CM filter.

The pair Y capacitor unit may include first and second Y capacitor units, the first Y capacitor unit is installed in both ends of the low voltage battery and discharges noises to the sash GND (earth) to reduce DM and CM noises, the CM filter is installed at both ends of the first Y capacitor unit to reduce the CM noise with respect to the noises reduced by the first Y capacitor unit, the DM filter is installed at both ends of the CM filter to reduce the DM noise with respect to the noise reduced by the CM filter, and the second Y capacitor unit is installed at both ends of the DM filter and discharges noises to the sash GND (earth) to reduce the DM and CM noises with respect to the noise reduced by the DM filter.

The low voltage EMI filter of an electric vehicle may further include a bridge unit installed at a merge unit connected to the sash GND (earth) so as to discharge a fed back ground noise to the sash GND (earth).

The bridge unit may be installed at one point among the sash GND (earth) merge unit.

The low voltage EMI filter of an electric vehicle may further include a bead installed between a GND end of a switched-mode power supply (SMPS), which is connected to the low voltage EMI filter, and the low voltage EMI filter and reducing a noise at the GND end of the SMPS.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

A low voltage electromagnetic interference (EMI) filter in an electric vehicle according to an embodiment will be described in detail with reference to the accompanying drawings. The invention may, however, be embodied in many different forms and should not be construed as being limited to the embodiments set forth herein; rather, that alternate embodiments included in other retrogressive inventions or falling within the spirit and scope of the present disclosure can easily be derived through adding, altering, and changing, and will fully convey the concept of the invention to those skilled in the art.

The terms used in this specification are selected to include current, widely-used, general terms, in consideration of the functions of an embodiment. However, the terms may represent different meanings according to the intentions and the practices of the skilled person in the art, the appearance of new technology, etc. In certain cases, a term may be one that is arbitrarily established by the applicant. In such cases, the meaning of the term will be defined in the relevant portion of the detailed description. As such, the terms used in the specification are not to be defined simply by the name of the terms but are to be defined based on the meanings of the terms as well as the overall description of embodiments.

In the specification, unless explicitly described to the contrary, the word "comprise" and variations such as "comprises" or "comprising", will be understood to imply the inclusion of stated elements but not the exclusion of any other elements.

Figure 3:
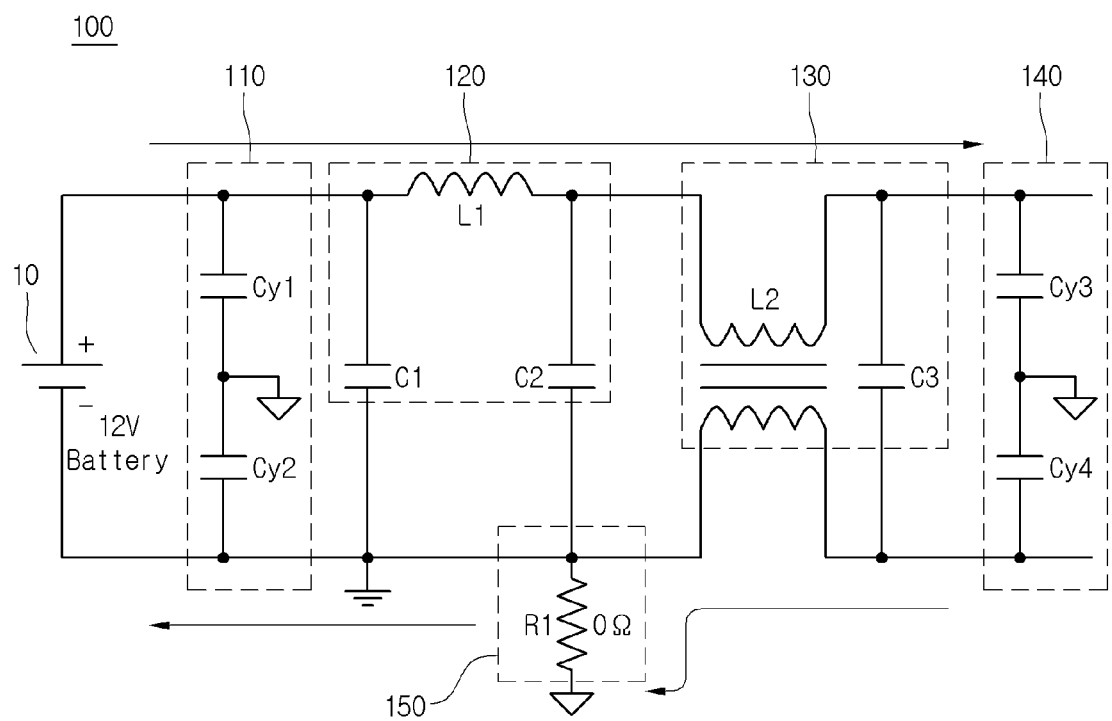
FIG. 3 is a view illustrating a configuration of a low voltage EMI filter in an electric vehicle according to an embodiment.

FIG. 3 is a view illustrating a configuration of a low voltage EMI filter in an electric vehicle according to an embodiment.

Referring to FIG. 3, a low voltage EMI filter 100 in an electric vehicle according to an embodiment includes a first Y capacitor unit 110, a DM filter 120, a CM filter 130, a second Y capacitor unit 140, and a bridge unit 150.

The first Y capacitor unit 110 is installed on both ends of a low voltage battery 10 to discharge a noise to a sash GND (earth). DM and CM noises may be reduced by the first Y capacitor unit 110.

The DM filter 120 is connected to both ends of the first Y capacitor unit 110 to filter out a DM noise.

The CM filter 130 is connected to both ends of the DM filter 120 to filter out a CM noise.

The second Y capacitor unit 140 is connected to both ends of the CM filter 130 to discharge noise to the sash GND (earth). The DM and CM noises may be reduced by the second Y capacitor.

The bridge unit 150 is installed in a merge unit connected to the sash GND (earth) for discharging a GND noise.

The low voltage EMI filter 100 may reduce a noise by filtering the CM and DM noises step by step through this configuration.

That is, the low voltage EMI filter 100 firstly discharges a noise to the sash GND (earth) through the first Y capacitor 110, secondly discharges a noise through the DM and CM filters 120 and 130, and thirdly reduces again a remnant noise to the sash GND (earth) through the second Y capacitor 140 connected behind the CM filter 130.

The low voltage EMI filter 100 discharges a fed back GND noise to the sash GND (earth) through the bridge unit 150, which is the merge unit connected to the sash GND (earth).

Figure 4:
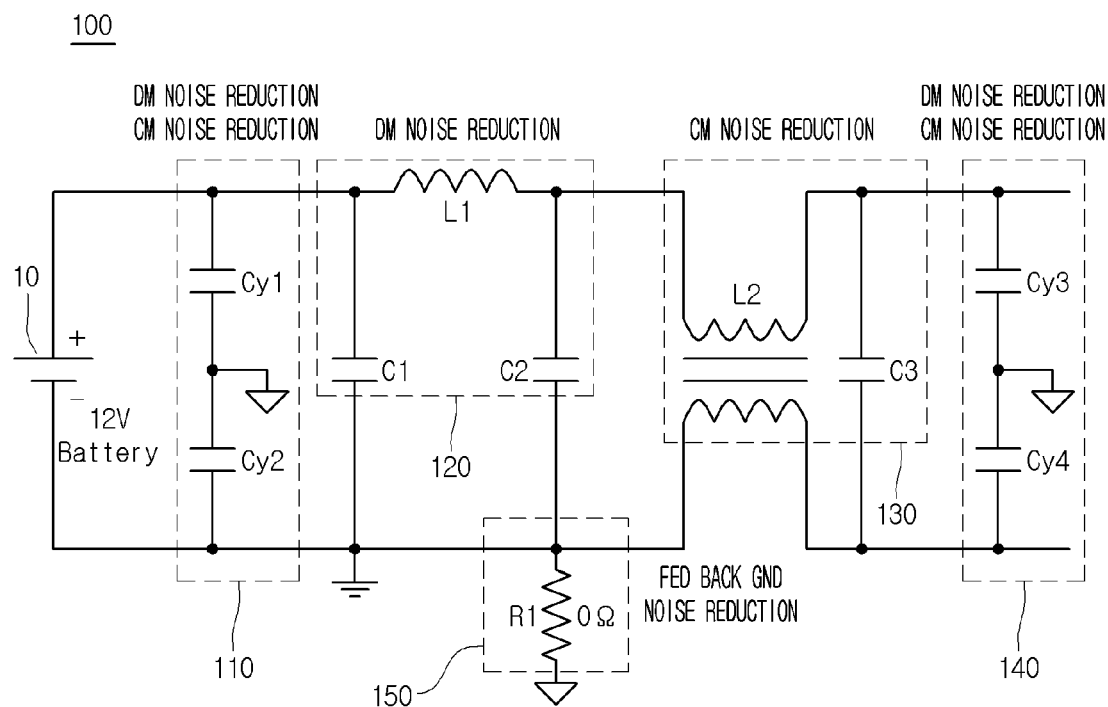
FIG. 4 is a view illustrating reducing a noise step by step in a low voltage EMI filter in an electric vehicle according to an embodiment.

FIG. 4 is a view illustrating reducing a noise step by step in a low voltage EMI filter in an electric vehicle according to an embodiment.

Referring to FIG. 4, as a first step for reducing noise of the low voltage EMI filter 100, the DM and CM noises may be reduced by the Y capacitor cy1 and cy2 in the first Y capacitor unit 110.

As a second step, the DM noise is absorbed by the capacitors C1 and C2 in the DM filter 120, which is a π filter, and is filtered out through the inductor L1. Accordingly, the DM noise may be reduced.

As a third step, the CM noise filtered once by the first Y capacitor unit 110 may be reduced through the inductor L2.

As a fourth step, the remnant CM and DM noises are absorbed again by capacitor Cy3 and Cy4 in the second Y capacitor unit 140.

As a fifth step, the fed back GND noise is discharged to the sash GND (earth) through a resistor R1 of the bridge unit 150 and is reduced.

Here, the bridge unit 150 is installed at one point. As an experiment result, when the bridge 150 is formed in plural, there is no noise reduction effect compared to one bridge unit 150.

Figure 5:
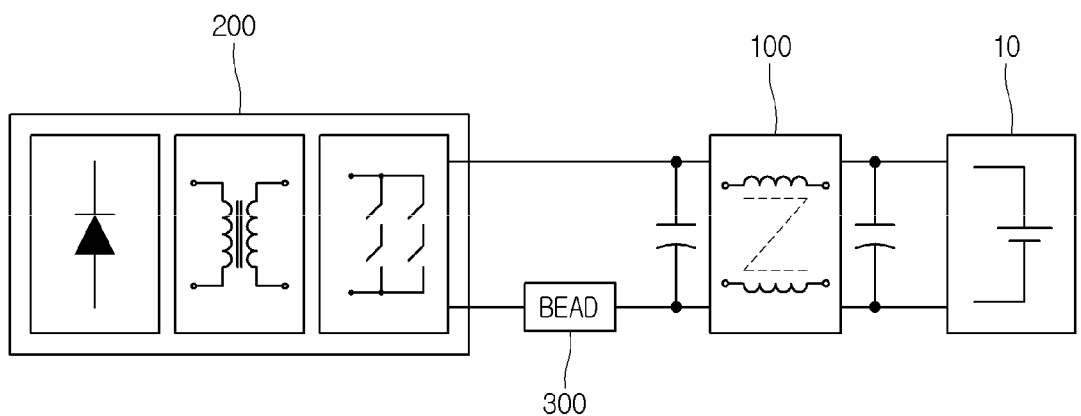
FIG. 5 is a view illustrating installing a bead between an EMI filter and the SMPS according to an embodiment.

FIG. 5 is a view illustrating installing a bead between the EMI filter and the SMPS according to an embodiment.

Referring to FIG. 5, an EMI filter 100 is installed in a battery 10, and a bead 300 is installed between GND ends of the EMI filter 100 and the SMPS 200. The bead 300 may be, for example, a ferrite bead.

Since the bead 300 is installed between the GND ends between the EMI filter 100 and the SMPS 200, a switching noise component may be filtered out in the GND end of the SMPS 200 through the bead 300, after a current is passed through the EMI filter 100 and before entering the SMPS 200.

The bead 300 has an effect of peak-like noise reduction around a CE measurement waveform between about 150 kHz to about 200 kHz in FIG. 6 to be described below.

The noise may be reduced by about 10dB, since the switching frequency of the SMPS 200 is about 170 kHz, and a noise component input to the GND end of the SMPS is primarily reduced by the bead 300 such that it has a lessened affect on the switching noise of the SMPS.

Figure 1:
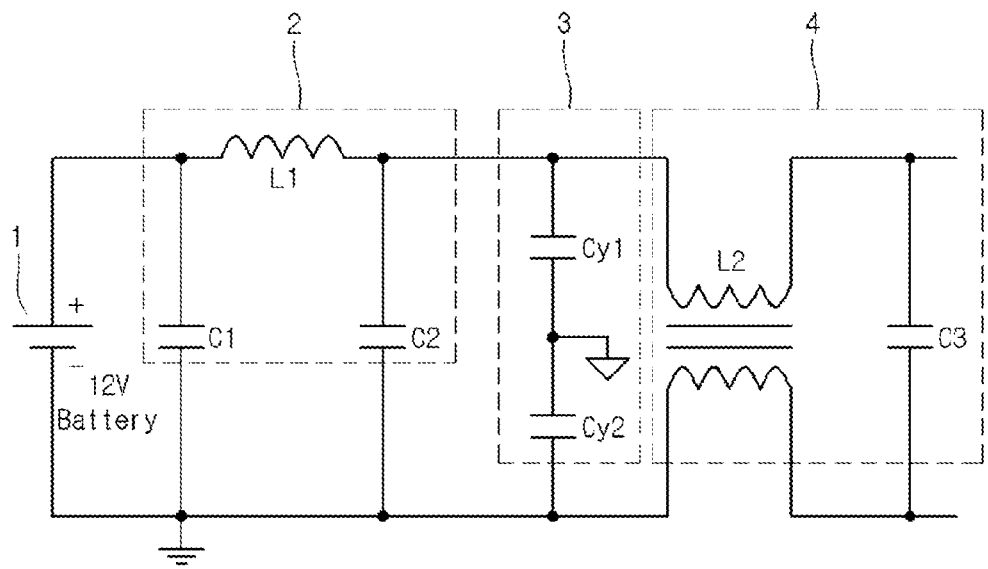
FIG. 1 is a view illustrating a typical electromagnetic interference (EMI) filter.
Figure 2:
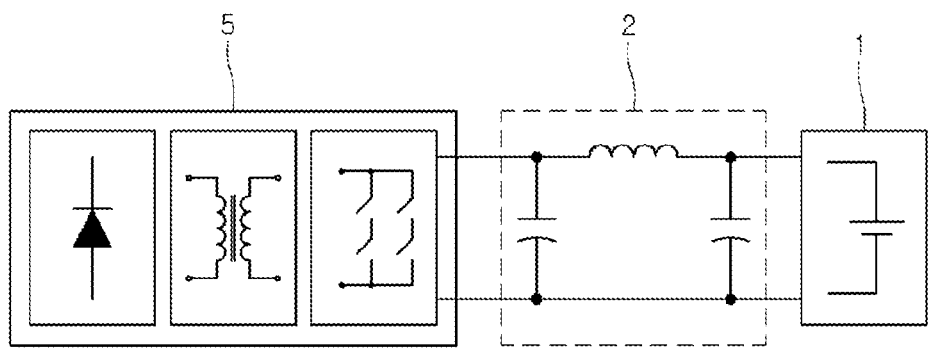
FIG. 2 is a view illustrating an effect of a noise generated when a typical EMI filter is connected to a switched-mode power supply (SMPS).
Figure 6:
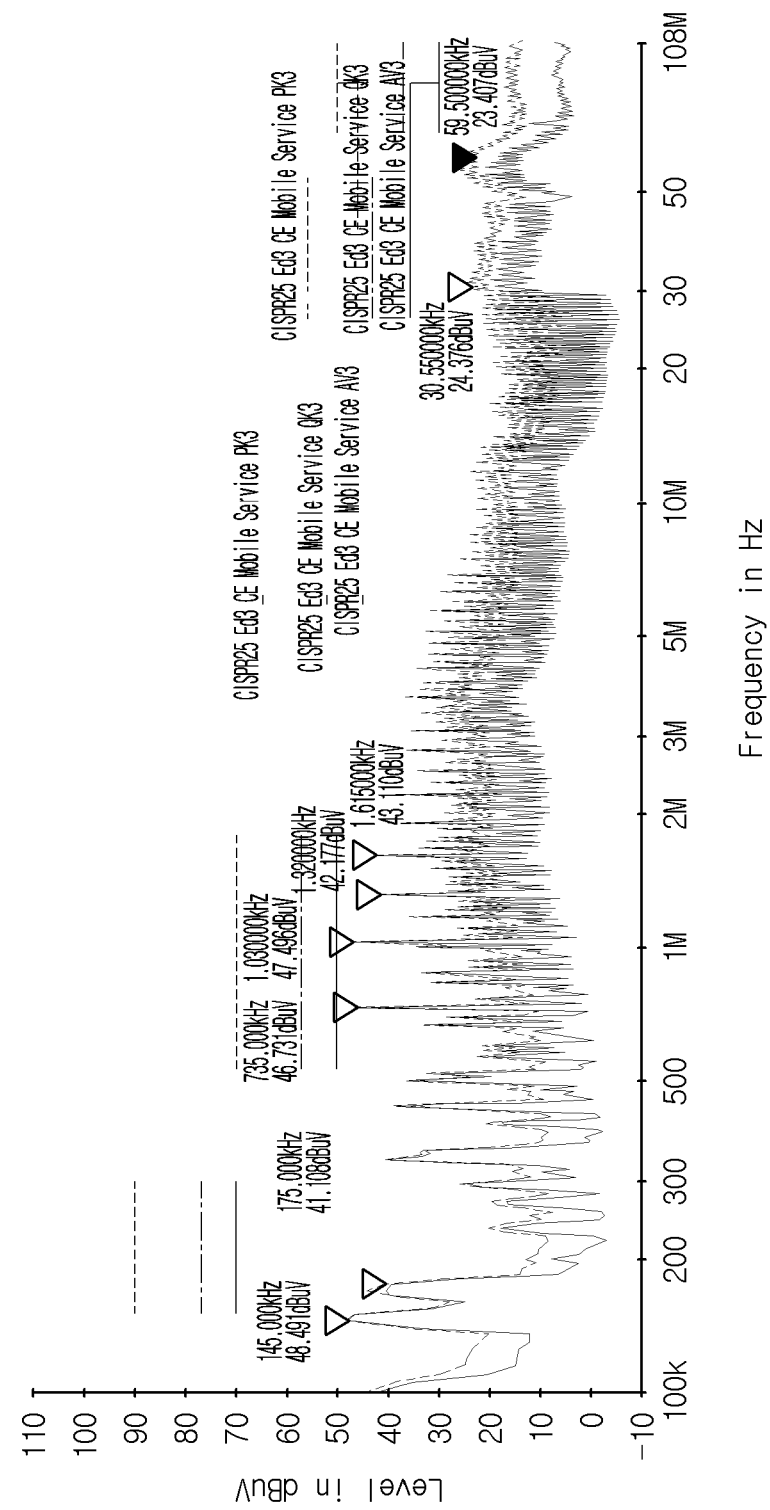
FIG. 6 is a graph showing a noise reduction effect in a low voltage EMI filter in an electric vehicle according to an embodiment.
Figure 7:
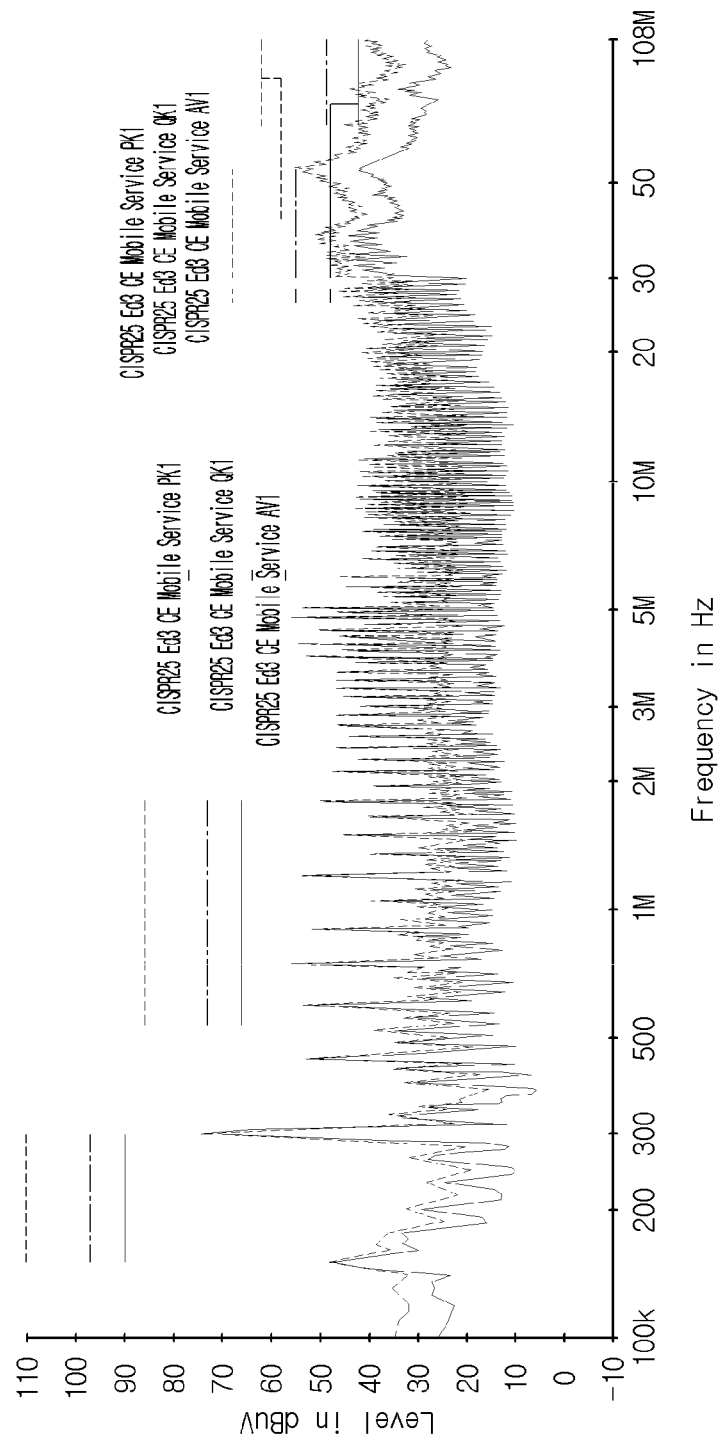
FIG. 7 is a graph showing a conducted emission measurement result measured in a typical low voltage EMI filter in an electric vehicle illustrated in FIG. 1.

FIG. 6 is a graph showing a noise reduction effect in a low voltage EMI filter of an electric vehicle according to an embodiment, and FIG. 7 is a graph showing conducted emission (CE) measurement results measured in the low voltage EMI filter of a typical electric vehicle shown in FIG. 1.

Referring to FIG. 6, a noise level reduction effect may be confirmed in an entire range of about 150 kHz to 108 MHz frequency band from CE measurement results measured in the low voltage EMI filter 100 of an electric vehicle according to an embodiment.

That is, it may be confirmed that an entire noise level over a 300 kHz band and an AM frequency band of 1 MHz or lower is reduced by about 10 dB from the measurement results of the low voltage EMI filter 100 of an electric vehicle according to an embodiment, compared to a graph of FIG. 7 which is measurement results from a typical EMI filter.

Furthermore, it can be confirmed that a noise level is entirely reduced by about 20 dB or more in an FM frequency band from about 30 MHz to about 108 MHz.

In particular, peak-like noise of 170 kHz band, which causes a problem in the SMPS 200, may be reduced through the bead 300 installed at a GND input end of the SMPS 200 described in relation to FIG. 5.

The EMI filter 100 according to an embodiment enables a noise reduction in the CE measurement result by reducing an EMI noise (a CM noise or a DM noise) step by step in reducing the EMI noise.

There is an effect of reducing an entire noise level in radiated emission as well as in CE measurement by using an EMI filter of an embodiment.

In an embodiment, it is described that an EMI filter includes a first Y capacitor unit, a DM filter, a CM filter, a second Y capacitor unit, which are sequentially connected, the embodiments are not limited hereto and the first Y capacitor unit, the CM filter, the DM filter, and the second capacitor unit may be sequentially connected in the order. That is, the first Y capacitor unit is installed in both ends of a battery, and discharges the noise to the sash GND (earth) to reduce the DM and CM noises. The CM filter is connected to both ends of the first Y capacitor unit to reduce the CM noise with respect to the noise reduced by the first Y capacitor unit. The DM filter is connected to both ends of the CM filter to reduce the DM noise with respect to the noise reduced by the CM filter. The second Y capacitor unit is connected to both ends of the DM filter to discharge a noise to the sash GND (earth), and may reduce the DM and CM noises with respect to the noise reduced by the DM filter.

An EMI filter according to an embodiment discharges CM and DM noises generated in a low voltage battery connection unit step by step to a sash ground (earth) to reduce a noise of the low voltage battery connection unit.

An electric vehicle is a noise cluster medium having a large noise component, and is like a noise cluster without being grounded moving like a typical industrial one. Therefore, it is most effective to maximally discharge a noise in each electronic device to a sash GND (GND of sash plane of a vehicle).

It is also important to discharge the EMI noise of the electronic device to the sash GND step by step rather than at the same time. The reason is that there is not an enough space to absorb noise components of a vehicle sash GND. According to embodiments, the noise can be efficiently reduced by reducing the EMI noise as much as possible inside the electronic device and discharging it to the sash GND step by step.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A low voltage electromagnetic interference (EMI) filter of an electric vehicle, the EMI filter comprising:
   a pair of Y capacitor units each installed in at least an input or an output end of the low voltage EMI filter; and
   a normal mode (DM) filter and a common mode (CM) filter installed between the pair of Y capacitor units,
   wherein the pair of Y capacitor units, the DM filter and the CM filter discharge CM and DM noises generated in a low voltage battery connection unit to a sash GND (earth) step-by-step and reduce noises of the low voltage battery connection unit,
   wherein a first Y capacitor unit is installed at both ends of the low voltage battery connection unit,
   wherein the DM filter is installed at both ends of the first Y capacitor unit to reduce DM noise,
   wherein the CM filter is installed at both ends of the DM filter to reduce CM noise, and
   wherein a second Y capacitor unit is installed at both ends of the CM filter.

2. A low voltage electromagnetic (EMI) filter of an electric vehicle, the EMI filter comprising:
   a pair of Y capacitor units each installed in at least an input or an output end of the EMI filter; and
   a normal mode (DM) filter and a common mode (CM) filter installed between the pair of Y capacitor units,
   wherein the pair of Y capacitor units, the DM filter and the CM filter discharge CM and DM noises generated in a low voltage battery connection unit to a sash GND (earth) step-by-step and reduce noises of the low voltage battery connection unit,
   wherein the pair of Y capacitor units comprises first and second Y capacitor units,
   wherein the first Y capacitor unit is installed in both ends of the low voltage battery connection unit,
   wherein the CM filter is installed at both ends of the first Y capacitor unit to reduce CM noise,
   wherein the DM filter is installed at both ends of the CM filter to reduce DM noise, and
   wherein the second Y capacitor unit is installed at both ends of the DM filter.

3. The low voltage EMI filter of claim 1, further comprising a bridge unit installed at a merge unit connected to the sash GND (earth) in order to discharge a fed back ground noise to the sash GND (earth).

4. The low voltage EMI filter of claim 2, further comprising a bridge unit installed at a merge unit connected to the sash GND (earth) in order to discharge a fed back ground noise to the sash GND (earth).

5. The low voltage EMI filter of claim 3, wherein the bridge unit is installed at one point among the sash GND (earth) merge unit.

6. The low voltage EMI filter of claim 4, wherein the bridge unit is installed at one point among the sash GND (earth) merge unit.

7. A low voltage electromagnetic (EMI) filter of an electric vehicle, the EMI filter comprising:
   a pair of Y capacitor units each installed in at least an input or an output end of the EMI filter; and
   a normal mode (DM) filter and a common mode (CM) filter installed between the pair of Y capacitor units; and
   a bead installed between a GND end of a switched-mode power supply (SMPS) and a GND end of the EMI filter and reducing noise at the GND end of the SMPS,
   wherein the pair of Y capacitor units, the DM filter and the CM filter discharge CM and DM noises generated in a low voltage battery connection unit to a sash GND (earth) step-by-step and reduce noises of the low voltage battery connection unit.

8. The low voltage EMI filter of claim 1, further comprising a bead installed between a GND end of a switched-mode power supply (SMPS) that is connected to the EMI filter and a GND end of the low voltage EMI filter and reducing noise at the GND end of the SMPS.

9. The low voltage EMI filter of claim 2, further comprising a bead installed between a GND end of a switched power mode supply (SMPS) and a GND end of the EMI filter and reducing noise at the GND end of the SMPS.

10. The low voltage EMI filter of claim 3, further comprising a bead installed between a GND end of a switched power mode supply (SMPS) and a GND end of the EMI filter and reducing noise at the GND end of the SMPS.

11. The low voltage EMI filter of claim 4, further comprising a bead installed between a GND end of a switched power mode supply (SMPS) and a GND end of the EMI filter and reducing noise at the GND end of the SMPS.

* * * * *